(12) United States Patent
Tseng

(10) Patent No.: US 6,383,937 B1
(45) Date of Patent: May 7, 2002

(54) METHOD OF FABRICATING A SILICON ISLAND

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 12 days.

(21) Appl. No.: 09/715,475

(22) Filed: Nov. 17, 2000

(51) Int. Cl.⁷ ................................................ H01L 21/00
(52) U.S. Cl. .......................... 438/705; 216/62; 216/79; 216/87; 216/99; 438/719; 438/734; 438/735; 438/753
(58) Field of Search ................................. 438/705, 712, 438/719, 723, 724, 734, 735, 743, 744, 745, 753, 756, 757; 216/2, 41, 62, 67, 79, 99, 87

(56) References Cited

U.S. PATENT DOCUMENTS 6,083,846 A * 7/2000 Fulford et al. .......... 438/753 X
6,309,975 B1 * 10/2001 Wu et al. .................... 438/705

* cited by examiner

Primary Examiner—William A. Powell
(74) Attorney, Agent, or Firm—J.C. Patents

(57) ABSTRACT

A method is disclosed for fabricating a semiconductor device structure which include a thin foot charge drain beneath the device on a silicon substrate. The structures retain high speed operation of SOI devices. In various embodiments, the invention includes forming a first diffusion-barrier layer on a semiconductor substrate, patterning the said first diffusion-barrier layer and the said silicon substrate to certain depth to form a trench, forming a second diffusion-barrier layer and patterning the said second diffusion-barrier layer to form a first spacer on the sidewall of the trench. Performing a directional etching to expose a portion of the sidewall of the trench. Introducing dopants into the said exposed sidewall to form a doped regions near the sidewall. Performing an isotropic etching using halogen gas plasma. Since the etch-rate of the doped silicon is higher than the undoped silicon, the doped silicon is easily and rapidly etched first, as the undoped silicon portion is exposed, the etching rate is substantially decreased or stopped forming a thin foot underneath the silicon island.

19 Claims, 5 Drawing Sheets

METHOD OF FABRICATING A SILICON ISLAND

BACKGROUND OF THE INVENTION

1. Field of the Invention

The present invention relates to a method of fabricating a silicon island in semiconductor substrate. More particularly, the invention provides a method of fabricating a silicon island of mono-crystalline silicon for making electronic devices.

2. Description of the Related Art

Since Silicon-On-Insulator (SOI) devices are fabricated on a thin silicon film on a insulator, the parasitic capacitance of the source/drain of MOSFET to the substrate below is greatly reduced and the operation speed is substantially improved compared to conventional microelectronic circuit fabrication on bulk silicon substrate (Bulk Devices). Thus SOI have tremendous advantage for very large scale integration (VLSI) of electronic devices over conventional Bulk Devices. In SOI fabrication, the channel length of the source/drain is reduced thereby decreasing the area and effectively increasing the integration of a semiconductor device. Additionally, device isolation of the SOI devices can be easily achieved with shallow trench isolation (STI) techniques by simply etching off unnecessary parts of silicon film surrounding areas to be used for SOI devices.

However, SOI devices are difficult to fabricate and expensive. Additionally, SOI devices have inherent drawbacks due to build-up of hot carrier generated during the operation. During SOI operation, from time to time, a high electric field concentrates around the drain region. Electric charges flowing in the channel are accelerated by the strong electric field around the drain and generates the opposite electric carriers by impact ionization which then flows back to the body of the device. Since SOI is completely isolated electrically from the substrate below, the created carriers cannot be drained into the substrate and thus builds up in the body of the SOI, this causes floating body effect, i.e. a shift of electrical potential in the body of SOI device with carrier build up. This floating body effects then induces undesirable transition in device performance such as change of threshold voltage with time.

Therefore, holes are confined inside the SOI device body. When a forward voltage is applied between the source and the body, holes in the body start to flow out of the source forming parasitic bipolar action path. With this new electron path formed away from gate electrode besides proper channel current path at the interface between silicon and gate oxide, the SOI device shows unexpected irregular operation so called kink effect.

Further, formation of electrical pathways through the insulating material requires process steps to open a small hole through the insulating region whose dimensions become less than 0.25 mm in the deep sub-micron device era (if the hole is larger compared with the insulating region, the device loses advantages of SOI device). Formation of such small holes precisely aligned within the insulating region whose dimensions are less than 0.25 mm is extremely difficult and almost impractical as a ULSI manufacturing method. Furthermore, the method requires a crystallization step even for constructing a single level planar circuit, which is inefficient, when a single crystal level is already available on the original substrate surface.

Therefore, improved devices structure and a simple fabrication which realize high speed operation as with conventional SOI devices but without any adverse effects related to the charge build-up is highly desired. In order to overcome the above defects a thin-foot charge drain beneath the conventional SOI structure to sweep out undesirable charge build-up generated by hot carrier effects during device operation desirable.

Referring to FIG. 1A, is a schematic diagram illustrating a conventional SOI, a silicon nitride film 102 about 2000 A thick is formed on a silicon substrate 100 using a CVD technique, a photoresist mask 104 is formed.

Next, referring to FIG. 1B, a reactive ion etching (RIE) is performed to penetrate etching through silicon nitride layer 102 and the underlying silicon substrate 100, forming a trench 105 forming a silicon island structure 112. During the etching process, a thin passivation layers 106 are formed on the sidewall.

Next, referring to FIG. 1C, an anisotropic (chemical) dry etching using CF4/O2 plasma is performed. The passivation layers 106 forms a protective layer on the sidewalls and is unaffected by etching. While the horizontal bottom surface has no passivation layers are etched eroding the bottom surface and forming a foot of a silicon island 210 as shown.

However, there is a problem in fabricating a silicon island with a thin foot region under the island using the method as described above. It is very difficult to control the etching process for obtaining a desired foot thickness in a deep submicron device, often over-etching and breaking off of the structure 112 occurs.

SUMMARY OF THE INVENTION

Therefore, in consideration of the above problems, the present invention provides a improved device structure and more particularly providing an improved fabrication method for forming a silicon island having a thin foot region under the silicon island.

The invention provides a fabrication method for forming a silicon island. A first diffusion-barrier layer including silicon oxide is formed on a semiconductor substrate. The first diffusion-barrier layer and the silicon substrate are patterned to a depth to form a trench. A second diffusion-barrier layer including silicon oxide or BPSG is formed and patterned to form a first spacer on the sidewall of the trench. An anisotropic etching is performed to expose a portion of the sidewall of the trench. A dielectric layer is formed over the substrate, dopants are introduced into the dielectric layer. The doped dielectric layer is patterned to form a second spacer. Some dopants from the doped dielectric layer diffuse into the substrate to form doped regions. An isotropic etching is performed. Since the etch-rate of the doped silicon oxide is higher than the undoped silicon oxide, the doped silicon oxide is easily and rapidly etched first. As the undoped silicon portion of the silicon substrate is exposed, the etching rate is substantially decreased or stopped forming a thin foot underneath the silicon island. Thus the isotropic etching can be easily controlled.

The invention provides a fabrication method for forming a silicon island. A silicon substrate is provided. A first diffusion-barrier layer is formed on the silicon substrate. The first diffusion-barrier and the silicon substrate is patterned to form a trench, wherein a silicon island structure is formed. A conformal second diffusion-barrier layer is formed on the first diffusion-barrier layer and inside the trench. The second diffusion-barrier layer is patterned to form a first spacer. A directional etching is performed to expose a portion of sidewall inside the trench. A step of blanket doping is performed on the silicon substrate. An etching step is performed on the substrate to form a thin foot region underneath the silicon island structure.

It is to be understood that both the foregoing general description and the following detailed are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and together with the description serve to explain the principles of the invention. In the drawings.

DESCRIPTION OF THE PREFERRED EMBODIMENTS

Figure 1A:
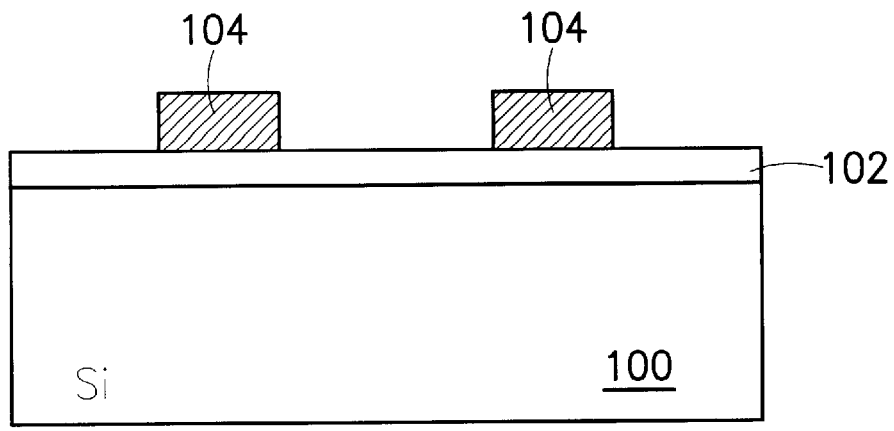
FIGS. 1A–1C are schematic cross sectional views showing a conventional silicon island structure.
Figure 1B:
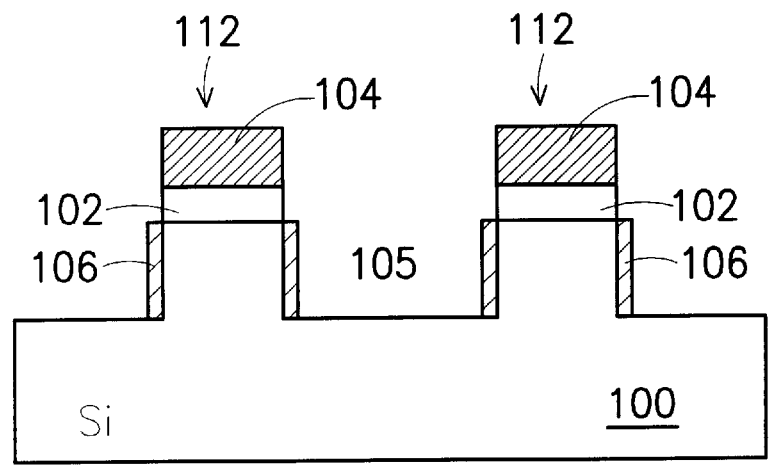
Figure 1C:
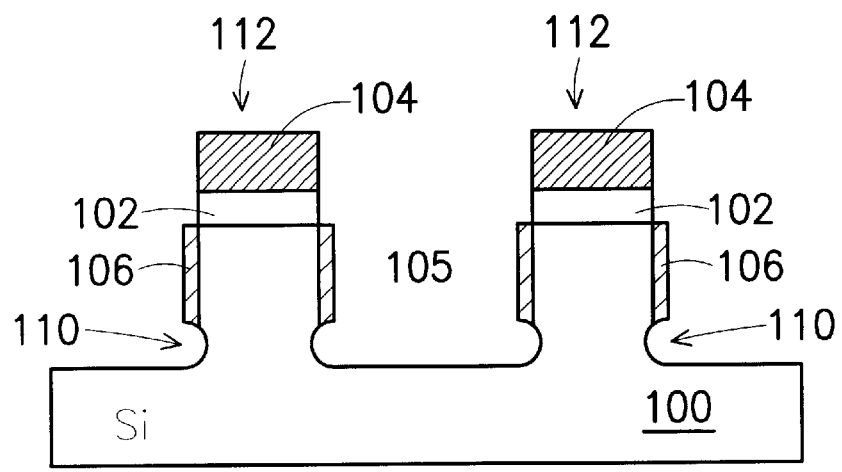

Reference will be made in detail to the present preferred embodiments of the invention, examples of which are illustrated in the accompanying drawings. Wherever possible, the same reference numbers are used in the drawings and the description to refer to the same or like parts.

FIGS. 2A through 2G are schematic, cross-sectional views showing the progression of fabrication steps forming a silicon island according to a first preferred embodiment of this invention.

Figure 3A:
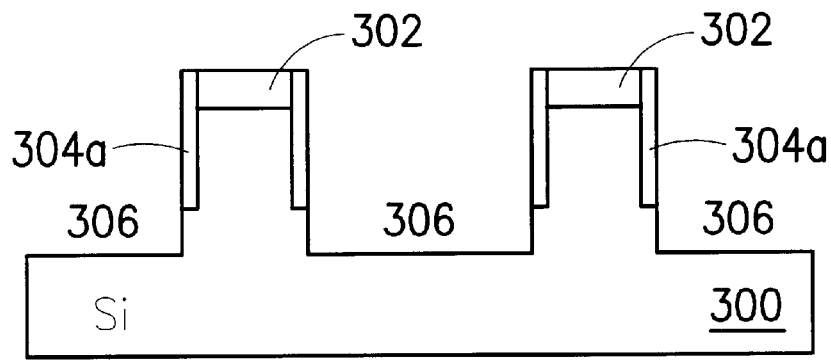
FIGS. 3A through 3C are schematic, cross sectional views showing the silicon island structure according to a second preferred embodiment of the invention.
Figure 3B:
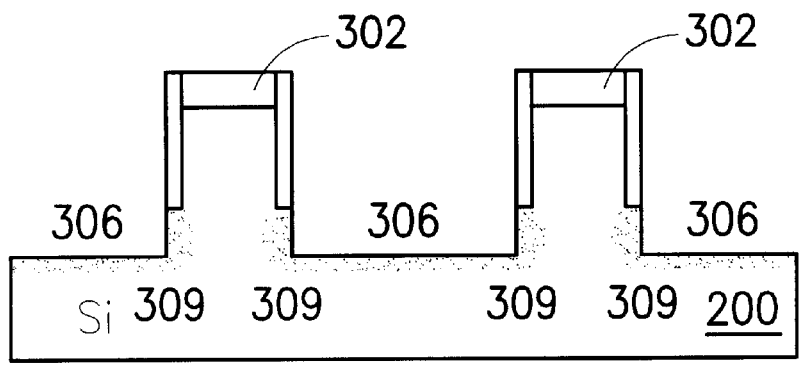
Figure 3C:
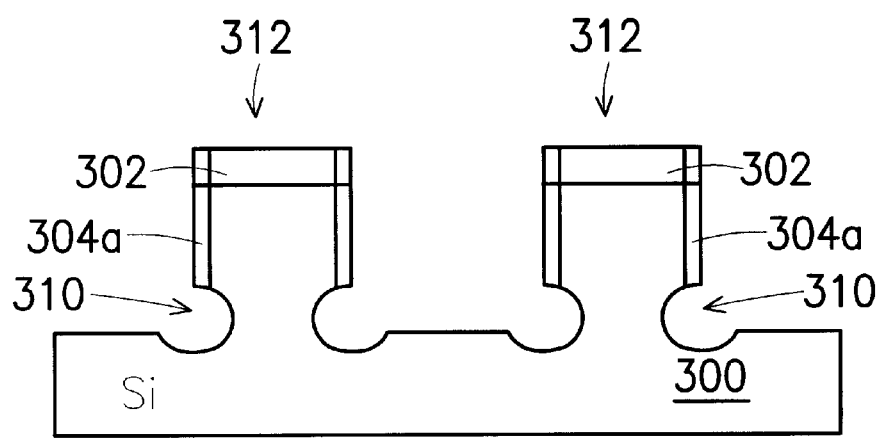

FIGS. 3A through 3C are schematic, cross sectional views showing the progression of fabrication steps forming a silicon island according to the second preferred embodiment of this invention.

First Preferred Embodiment

Figure 2A:
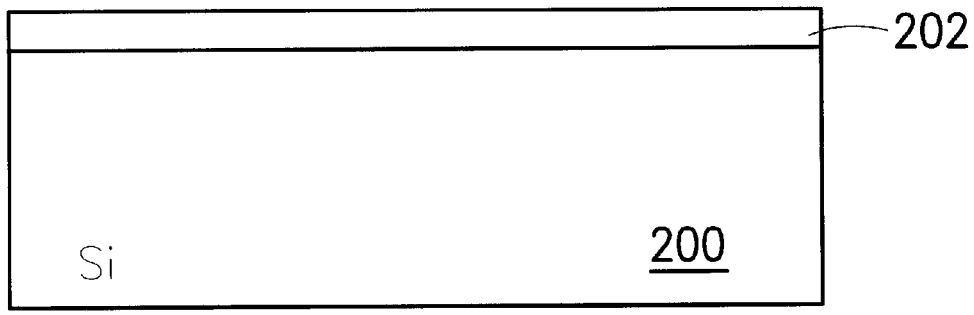
FIGS. 2A through 2G are schematic, cross-sectional views showing a method of fabricating a silicon island structure according to a first preferred embodiment of the invention.

Referring to FIG. 2A, a silicon substrate 200 is provided. A first diffusion-barrier layer 202 is formed on the silicon substrate 200. The first diffusion-barrier layer 202 is made of, for example, silicon oxide, silicon nitride, oxynitride or combination thereof. The thickness of first diffusion-barrier layer 202 is about 500 to 2000 Å. The first diffusion-barrier layer 202 can be formed by chemical vapor deposition (CVD).

Figure 2B:
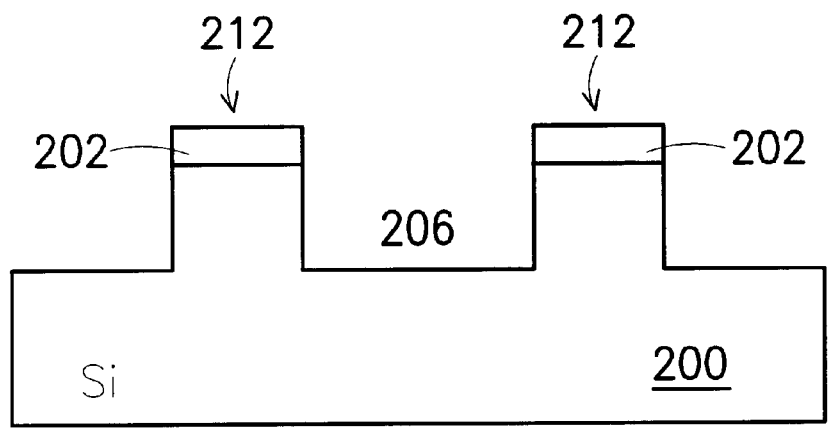

Referring to FIG. 2B, the first diffusion-barrier layer 202 and the silicon substrate 200 are patterned by anisotropic etching to form a trench 206. Silicon island structure 112 is formed.

Figure 2C:
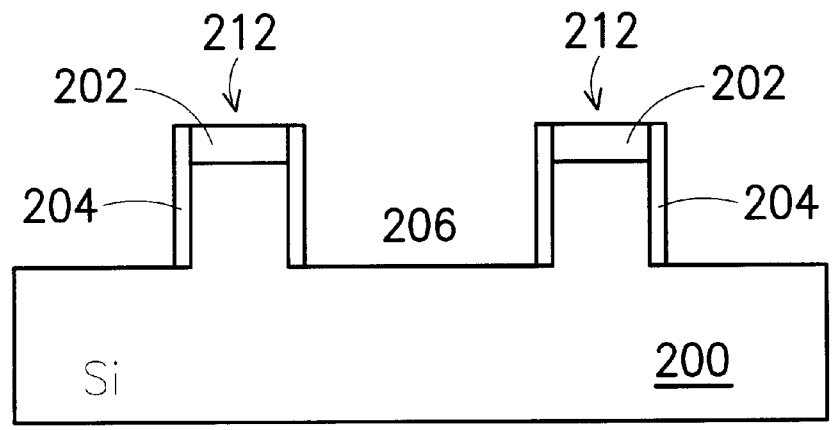
Figure 2D:
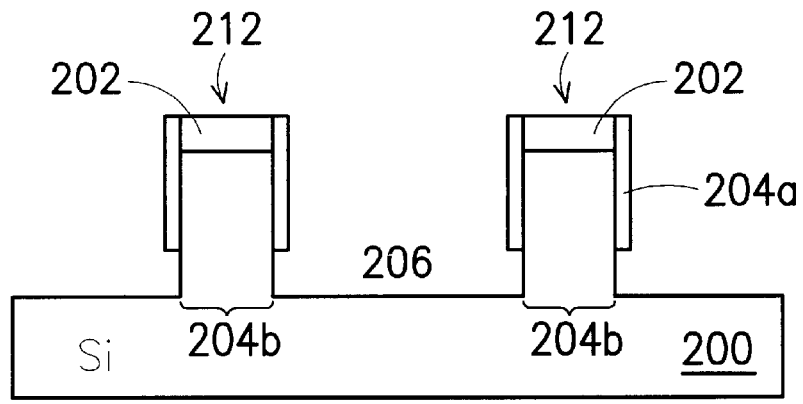

Referring to FIG. 2C, a second diffusion-barrier layer 204 is formed over the silicon substrate 200 and the first diffusion-barrier layer 202. The second diffusion-barrier layer 204 is made of, for example, silicon oxide, silicon nitride, oxynitride or combination thereof. The thickness of second diffusion-barrier layer 204 is about 500 to 2000 Å. The second diffusion-barrier layer 204 can be formed by chemical vapor deposition (CVD). The second diffusion-barrier layer 204 is then performed by a directional etching process such as plasma etch-back to form a first spacer 204a on the sidewall of the trench 206 and exposing a portion of the substrate inside the trench 206, as shown in FIG. 2D.

Figure 2E:
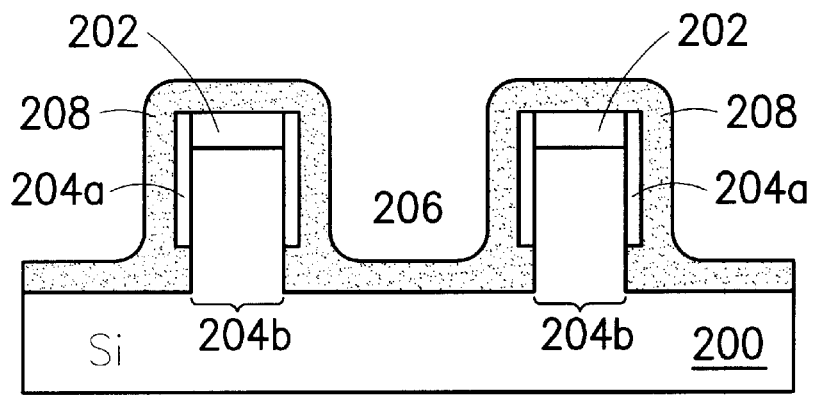

Referring to FIG. 2E, a conformal doped dielectric layer, for example, a doped PSG or a doped BPSG layer 208 is formed on the first diffusion-barrier layer 202, the first spacer 204a and the exposed portion 204b of the sidewall. The doped dielectric layer 208 can be formed by, for example, chemical vapor deposition in a dopant-containing environment. That is, the dielectric layer 208 is doped with dopants in-situ. Except for being doped in-situ, the doping process also can be performed by putting the silicon substrate 200 in a high temperature dopant-containing environment to have blanket doping after deposition. The doped dielectric layer 208 is patterned to form a second spacer 208a on the sidewall of the trench 206.

Figure 2F:
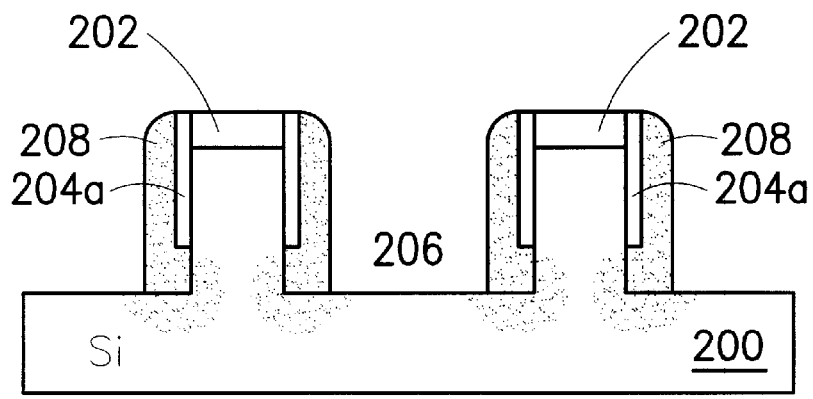
Figure 2G:
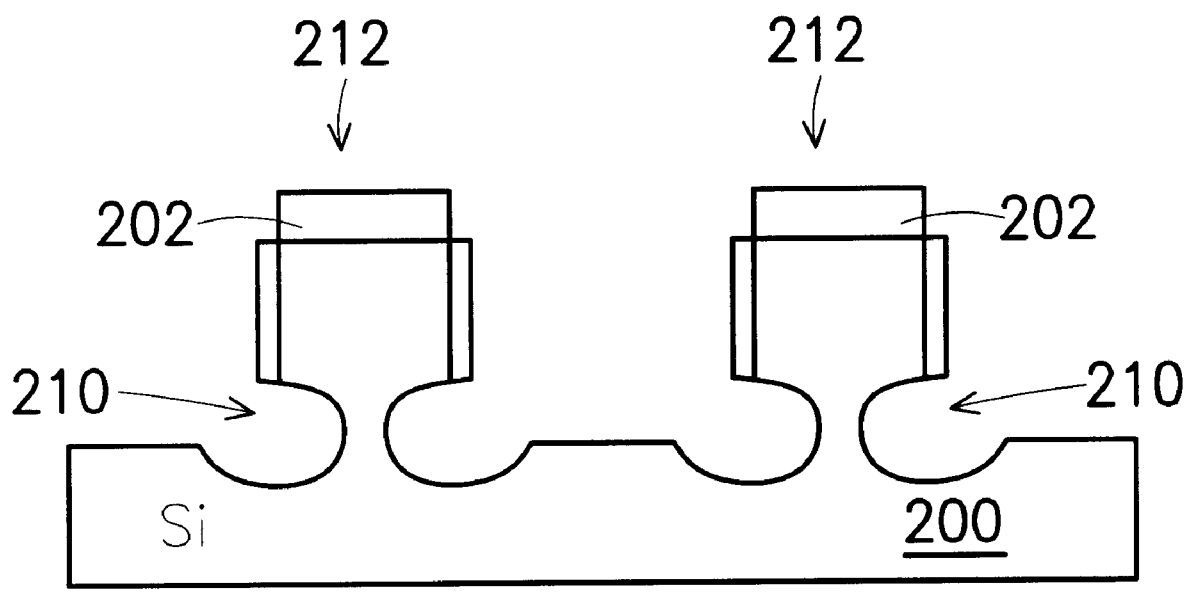

Dopants in the doped second spacer 208a diffuses into the silicon substrate 200 through the exposed portion 204b on the sidewall of the trench 206 and forming doped regions 209 as shown in the FIG. 2F. An etching process such as isotropic etching in halogen gas plasma is performed. Since the etchrate of the doped silicon is higher than the undoped silicon, the doped silicon in the doped region 209 of the silicon substrate 200 is easily and rapidly etched away first. As the undoped silicon portion of the silicon substrate is exposed, the etching rate is substantially decreased and the etching process can be easily controlled. A thin foot region 210 is formed underneath the silicon island structure 212. Thus, the etching can be easily controlled preventing over-etching. The silicon island structure 212 with the thin foot region 210 can be easily formed and controlled.

According to Second Preferred Embodiment.

Referring to FIG. 3A, a silicon island structure 312 comprising a silicon substrate 300 is provided. A first diffusion-barrier layer 302 including silicon oxide with a thickness of about 500 to 2000 Å, an isolation trench 306, a first spacer 304a of thickness about 200–1000 Å, and exposed sidewall 304b are provided. The method for forming the silicon island structure 312 is similar with the method disclosed in FIG. 2D.

Referring to FIG. 3B, a blanket doping process is performed on the silicon substrate 300. The doping process can be performed by putting the silicon substrate 300 in a high temperature dopant-containing environment to have blanket doping. Doped regions 309 are formed near the lower portions of the sidewalls as shown in FIG. 3B. An isotropic etching using halogen plasma is performed. Since the etch-rate of the doped silicon is higher than the undoped silicon, the doped silicon is easily and rapidly etched first, as the undoped silicon portion of the silicon substrate is exposed, the etching rate is substantially decreased or stopped. A thin foot region 310 underneath the silicon island structure 312 is formed. Thus the etching can be easily controlled preventing over-etching.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a semiconductor device comprising:

providing a silicon substrate;

forming a first diffusion-barrier layer on the silicon substrate;

patterning the first diffusion-barrier and the silicon substrate to form a trench, wherein a silicon island structure is formed;

forming a conformal second diffusion-barrier layer on the first diffusion-barrier layer and inside the trench;

patterning the second diffusion-barrier layer to form a first spacer;

performing a directional etching to expose a portion of sidewall inside the trench;

forming a doped dielectric layer over the substrate;

patterning the doped dielectric layer to form a second spacer, wherein a portion of the dopants is diffused into the silicon substrate through the exposed portion on the sidewall of the trench and a doped region is formed in the silicon substrate beside an interface between the second spacer and the substrate;

removing the second spacer; and performing an etching on the substrate to form a thin foot region underneath the silicon island structure.

2. The method of claim 1, wherein the first diffusion-barrier layer includes silicon oxide, silicon nitride, oxynitride or combination thereof.

3. The method of claim 1, wherein the first diffusion-barrier layer is formed by chemical vapor deposition (CVD), and the thickness of the first diffusion-barrier layer is about 500 to 2000 Å.

4. The method of claim 1, wherein the second diffusion-barrier layer comprise of silicon oxide, silicon nitride, oxynitride or combination thereof.

5. The method of claim 1, wherein the second diffusion-barrier layer is formed by chemical vapor deposition (CVD), and the thickness of the second diffusion-barrier layer is about 200 to 1000 Å.

6. The method of claim 1, wherein the second diffusion-barrier layer includes BPSG.

7. The method of claim 1, wherein the step of forming the doped dielectric layer is by chemical vapor deposition in a dopant-containing environment.

8. The method of claim 1, wherein the etching is performed by isotropic etching.

9. The method of claim 8, wherein the etching is performed by using halogen gas plasma.

10. The method of claim 1, wherein the etching the substrate to form the thin foot region comprises etching away the doped region in the substrate; and etching a portion of the substrate beside the doped region to form the thin foot region, wherein the etching rate is substantially decreased in the undoped portion of the substrate.

11. A method of manufacturing a semiconductor device comprising:

providing a silicon substrate;

forming a first diffusion-barrier layer on the silicon substrate;

patterning the first diffusion-barrier and the silicon substrate to form a trench, wherein a silicon island structure is formed;

forming a conformal second diffusion-barrier layer on the first diffusion-barrier layer and inside the trench;

patterning the second diffusion-barrier layer to form a first spacer;

performing a directional etching to expose a portion of sidewall inside the trench;

performing blanket doping on the silicon substrate; and performing an etching on the substrate to form a thin foot region underneath the silicon island structure.

12. The method of claim 11, wherein the first diffusion-barrier layer comprise of silicon oxide, silicon nitride, oxynitride or combination thereof.

13. The method of claim 11, wherein the first diffusion-barrier layer is formed by chemical vapor deposition (CVD), and the thickness of the first diffusion-barrier layer is about 500 to 2000 Å.

14. The method of claim 11, wherein the second diffusion-barrier layer comprise of silicon oxide, silicon nitride, oxynitride or combination thereof.

15. The method of claim 11, wherein the second diffusion-barrier layer is formed by chemical vapor deposition (CVD), and the thickness of the second diffusion-barrier layer is about 200 to 1000 Å.

16. The method of claim 11, wherein the second diffusion-barrier layer includes BPSG.

17. The method of claim 11, wherein the etching is performed by isotropic etching.

18. The method of claim 17, wherein the etching is performed by using halogen gas plasma.

19. The method of claim 11, wherein the etching the substrate to form the thin foot region comprises etching away the doped region in the substrate; and etching a portion of the substrate beside the doped region to form the thin foot region, wherein the etching rate is substantially decreased in the undoped portion of the substrate.

* * * * *